United States Patent [19]

McMillan et al.

[11] Patent Number: 5,119,760
[45] Date of Patent: Jun. 9, 1992

[54] METHODS AND APPARATUS FOR MATERIAL DEPOSITION

[75] Inventors: Larry D. McMillan; Carlos A. Paz de Araujo, both of Colorado Springs, Colo.

[73] Assignee: Symetrix Corporation, Colorado Springs, Colo.

[21] Appl. No.: 470,800

[22] Filed: Jan. 26, 1990

Related U.S. Application Data

[62] Division of Ser. No. 290,468, Dec. 27, 1988.

[51] Int. Cl.$^5$ .............................................. C23C 16/00
[52] U.S. Cl. .................................... 118/722; 118/725; 118/50.1
[58] Field of Search ....................... 118/722, 725, 50.1

[56] References Cited

U.S. PATENT DOCUMENTS 3,661,637 5/1972 Sirtl ..................................... 427/54.1
4,489,102 12/1984 Olmer ................................. 427/54.1

FOREIGN PATENT DOCUMENTS 62-22420 1/1987 Japan .

*Primary Examiner*—Richard Bueker
*Attorney, Agent, or Firm*—Irving M. Weiner; Joseph P. Carrier; Robert M. Petrik

[57] ABSTRACT

The present invention discloses methods and apparatus for depositing thin films of complex (compound) materials, including ferroelectrics, superconductors, and materials with high dielectric constants through a technique which is hereby entitled photo-enhanced chemical vapor deposition and activation (PECVDA). The technique involves the use of multiple heating sources including a resistive heat bias heater, a tuned optical source (UV or laser) and a source (halogen lamps or microwave sources) for applying high energy, rapid thermal pulses in a precise time sequence.

20 Claims, 2 Drawing Sheets

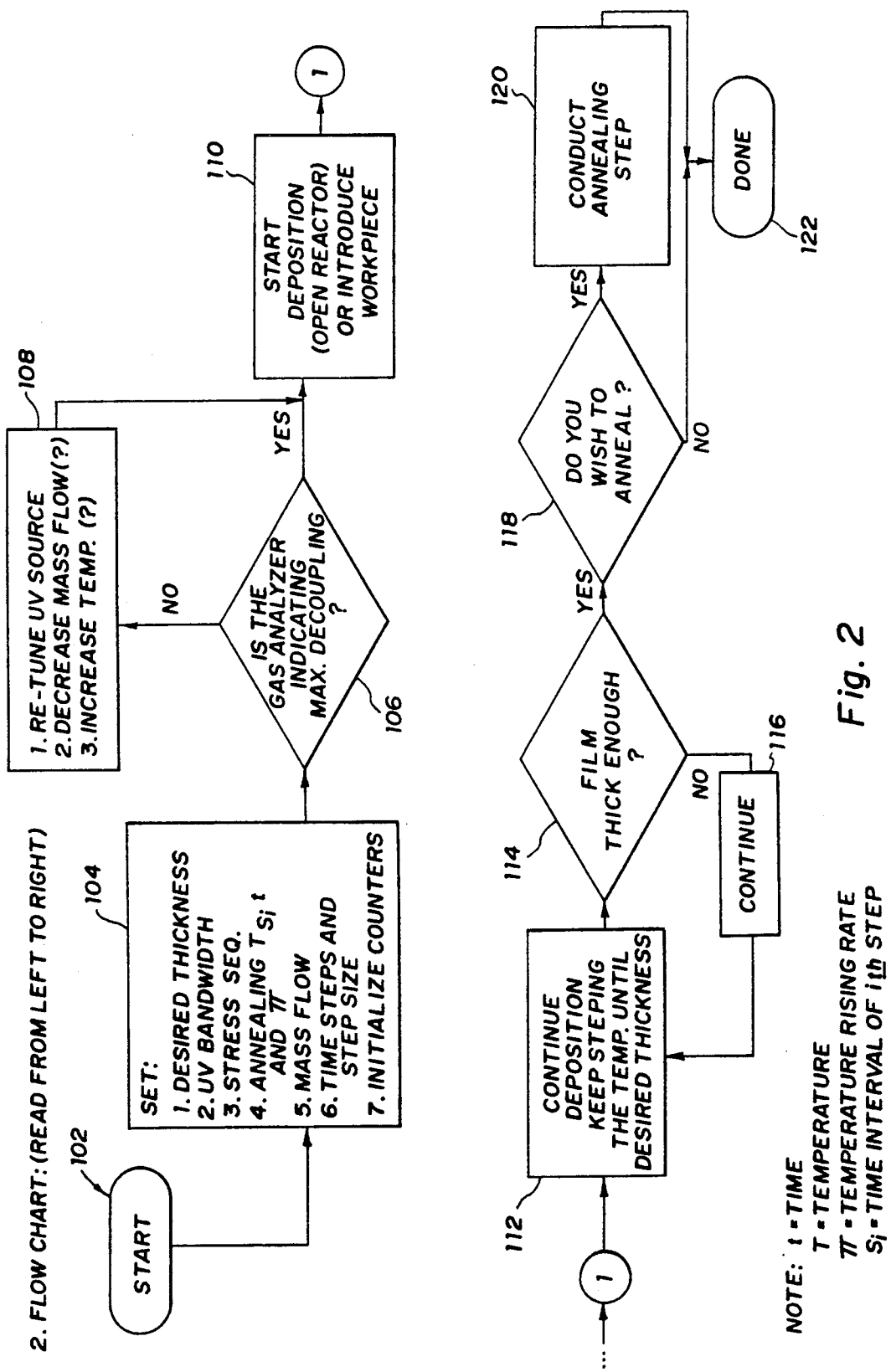

METHODS AND APPARATUS FOR MATERIAL DEPOSITION

This is a divisional application of application Ser. No. 07/290,468 filed Dec. 27, 1988.

BACKGROUND OF THE INVENTION

1. Field of the Invention

The present invention pertains to methods for depositing high quality films of complex (compound) materials on substrates at high deposition rates, and apparatus for effecting such methods. More particularly, the present invention pertains to photo-enhanced chemical vapor deposition (PECVD) methods for depositing high quality, stoichiometrically-correct, thin films of a large variety of complex compounds at high deposition rates, and computer controlled apparatus for effecting such methods.

2. Description of the Relevant Art

There are known methods for depositing thin films of complex compounds such as metal oxides, ferroelectrics, superconductors, materials with high dielectric constants, gems, etc. Such known methods include RF sputtering, chemical vapor deposition (CVD) and spin coating processes.

The known methods, however, have many problems and disadvantages associated therewith. For example, with RF sputtering methods most commercially available target sources have significant quantities of impurities therein so that even before you begin the sputtering process there is a significant chance of failure due to the impurities in the target source. Further, it is difficult to control chemical proportions of materials deposited in a sputtering process so that a thin film which is eventually deposited has many variations of chemical composition therethrough and across the surface thereof.

Spin deposition processes of complex thin films usually involve two primary steps. An initial step of spinning a stabilized liquid source, such as a sol-gel, onto a substrate, and a second step of drying the liquid spun onto the substrate. The initial step of spinning liquid onto a substrate is usually done in the open environment, which undesirably permits the liquid to absorb impurities (including moisture) from the environment. Further, the drying step of the process is rather violent due to the evaporation of organic precursors from the liquid, which leaves damaging pores (or pop holes) in the thin film.

With regard to known CVD processes, significant disadvantages are associated with the handling of the raw materials that are injected into a CVD reactor inasmuch as these materials are usually very toxic and the Environmental Protection Agency has imposed very strict standards for handling of these materials, which makes such handling both difficult and expensive. Further, the reactive nature of known CVD depositions (in which two or more vaporized components are reacted and then deposited on a substrate) is generally hard on the CVD reactor itself, so that the reactor must be constructed to withstand the reactions and must often be maintenanced at considerable cost. Relatedly, it is very difficult to consistently deposit stoichiometrically correct, multiple-component thin films using presently available CVD equipment.

Additionally, CVD processes and subsequent annealing processes, which are required with many thin films, such as ferroelectrics, are normally operated at relatively high reactor temperatures, which tends to damage the thin films and the substrates onto which they are deposited. Damage to the thin films include removal of certain critical elements (such as lead) therefrom; formation of pores, secondary phases, and large grains; and serious non-stoichiometry.

One known modification to the CVD processes is to add a means of photo-enhancement as a secondary heating means for inducing chemical reactions of the vaporized compounds within the CVD reactor. Such known photo-enhancement techniques reduce some of the problems associated with CVD processes, but are still insufficient for depositing high quality, stoichiometrically correct thin films of many complex compounds in a practical, commercially-viable manner.

The present invention has been developed to overcome the many problems and disadvantages associated with known deposition techniques for depositing thin films of complex compounds including those discussed above, and to generally fulfill a great need in the art by providing a production worthy process which can be used to produce a large variety of high quality, complex thin films.

SUMMARY OF THE INVENTION

According to the present invention, there is provided a method of depositing a thin film of a complex compound on a substrate, comprising the steps of: providing a substrate in an enclosed deposition chamber; introducing a vaporized compound source into the deposition chamber at a controlled flow rate, and controlling a first heating means to apply a spectral heating bath to the vaporized source within the deposition chamber in a controlled manner to dissociate at least one component of the vaporized source therefrom and to permit the component to be deposited on the substrate. The spectral heating bath is tuned to provide optimal energy for dissociating the component from the vaporized compound source.

Also, a method according to the present invention will preferably include a further step of controlling another heating means to apply heating pulses to the vaporized source within the deposition chamber, the other heating means being preferably controlled to apply the heating pulses in a time sequence based on the controlled flow rate of the vaporized source and a desired thin film thickness.

Additionally, a method according to the present invention will precisely control the heating means in a time sequence whereby the component dissociated from the vaporized source is dynamically activated as it is being deposited on the substrate.

It is an object of the present invention to provide precisely controllable apparatus and methods for depositing high quality thin films of complex compounds such as ferroelectrics, super-conductors, materials having high dielectric constants, etc.

It is a further object of the present invention to provide such methods and apparatus which utilize stabilized, vaporized chemical sources (or sources which do not react within the deposition chamber) so as to simplify handling of the sources, to simplify construction and maintenance of the deposition apparatus, and to further assure high quality of the thin films produced thereby.

It is yet another object of the present invention to provide such methods in which the deposited thin films are subsequently activated and/or annealed in-situ within the deposition chamber in a controlled manner which does not deteriorate the quality of the thin films.

It is still another object of the present invention to provide such methods which are precisely controlled using computerized process control apparatus and techniques.

Other objects, advantages and salient features of the present invention will become apparent from the following detailed description which, when taken into conjunction with the annexed drawings, discloses preferred embodiments of the present invention.

BRIEF DESCRIPTION OF THE DRAWINGS

FIG. 2 is a flow chart of a preferred embodiment of a method of deposition according to the present invention.

DETAILED DESCRIPTION OF THE PREFERRED EMBODIMENTS

Figure 1:
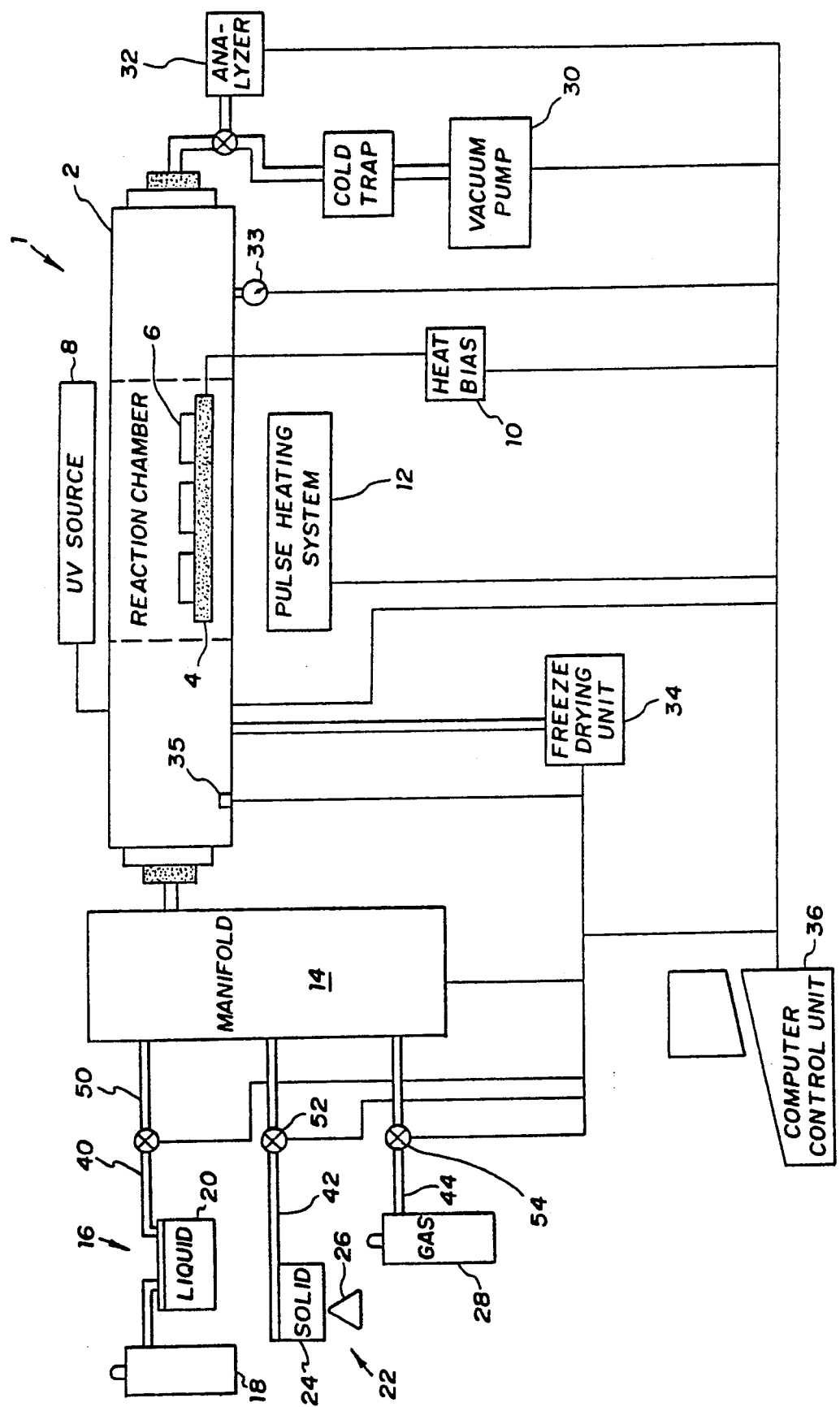
FIG. 1 is a schematic view of a chemical vapor deposition apparatus according to a preferred embodiment of the present invention.

Referring to FIG. 1, there is generally shown a preferred embodiment of a CVD apparatus according to the present invention, the apparatus being generally indicated at 1. The apparatus 1 includes a deposition chamber 2 defining an enclosed deposition space therein, a substrate holder 4 within the deposition chamber 2 and which has one or more substrates 6 supported thereon, a vaporized source manifold 14 for introducing a vaporized source(s) into the deposition chamber 2, first, second and third heating means 8, 10, 12, respectively, for applying heat to the deposition chamber 2, liquid, solid and gaseous feed units 16, 22 and 28, respectively, for introducing vaporized compound sources into the manifold 14, a vacuum pump 30 cooperating with the deposition chamber 2, an analyzer 32 for analyzing the composition of gases exhausted from the deposition chamber 2, a cooling unit 34 for cooling the deposition chamber 2, pressure and temperature sensors 33, 35, respectively, and a computer control unit 36 which is used to precisely control the apparatus Specifically referring to the feed units 16, 22 and 28, these units are used to generate and feed a vaporized source of at least one compound into the manifold 14, which in turns introduces or feeds the vaporized source into the deposition chamber 2. The liquid feed unit 16 includes at least one liquid source container 20 and at least one carrier gas source 18 which is passed through the liquid source in the container 20 so as to become saturated with the liquid source(s) and then fed into the manifold 14 through a tube 40 or the like. The carrier gas(ses) may be inert or active or may contain a catalyst to increase the deposition rate.

The solid feed unit 22 includes at least one container 24 for containing at least one solid source, and a heating means 26 which heats the container 24 to vaporize the solid source therein, the vapors of which are then fed into the manifold 14 through an appropriate connection such as tube 42.

The gas unit 28 can be used to feed at least one gaseous compound into the manifold 14 through an appropriate connection means such as pipe 44.

Flow control valves 50, 52, 54 are provided on the connector pipes 40, 42, 44, respectively, and are controlled by the computer control unit 36 to precisely monitor and limit the flow rate of the vaporized sources into the manifold 14 and into the deposition chamber 2.

It will be understood that not all of the feed units 16, 22, 28 will be used in every operation of the CVD apparatus 1, but rather one or more of the units 16, 22, 28 will be used as necessary to deposit a given thin film. Also, it will be understood that more than one of each of the units 16, 22, 28 can be used to feed a vaporized source into the manifold 14 for any given thin film deposition.

As discussed above, the present CVD apparatus and methods are specifically suited for the deposition of high quality thin films of complex compounds such as ferroelectrics, superconductors, materials with high dielectric constants, gems, etc. For example, the present CVD apparatus and techniques can be used to deposit thin films of ferroelectric materials having a general composition of $ABO_3$, including $PbTiO_3$, $Pb_xZr_yTiO_3$, and $Pb_xLa_yZr_2TiO_3$.

According to one preferred aspect of the present invention, each vaporized source introduced into the deposition chamber 2 from the manifold 14 will be stabilized such that no, or substantially no, chemical reactions occur within the chamber 2. Rather, the stabilized, vaporized source will simply be heated such that a desired component or components will be dissociated, decoupled or cracked from the vaporized source and subsequently deposited on the substrate 6 within the chamber 2. In other words, the manifold 14 and vaporized source generators 16, 22 and 28 are adapted to introduce a vaporized compound source into the deposition chamber 2 as a stabilized source including a substantially stoichiometrically-correct quantity of at least one desired complex chemical compound, and which will substantially not react within the deposition chamber and thus not destabilize the complex chemical compound of its pre-established, stoichiometrically-correct formulation.

For example, thin films of the above-discussed ferroelectric materials could be generated from an appropriate, stabilized sol-gel or metal organic decomposition (MOD) formulation which would be vaporized using the liquid source feed unit 16. Note, an MOD formulation is quite similar to a sol-gel formulation in that it basically includes a dispersion of a micropowder of the desired substance into a solution including xylene as the organic base, whereas sol-gel formulations use solutions including alcohols as the organic base. Once the vaporized source is introduced into the deposition chamber 2, heat is applied to the vaporized source in a novel manner discussed hereinbelow to dissociate or crack the desired component(s) from the organic base so that the component(s) can be deposited on the substrate 6.

In this regard, research and experience by the present inventors in the synthesis of ferroelectric $ABO_3$ perovskites in organic solutions have shown that stabilized sources of these materials can be designed and generated with relative ease in liquid form, including sol-gel and MOD formulations discussed above. These stabilized liquid sources may, in turn, be utilized to produce a large variety of new, complex (compound), stoichiometrically correct thin films according to the present invention.

Use of stabilized sources is a preferred aspect of the present invention for several reasons. First, the sources themselves are relatively easy to generate, even for complex compounds as discussed above. Further, such stabilized sources are substantially less toxic and easier to handle than corresponding reactants, whereby the stabilized sources can be handled and processed at a substantially lower cost than the corresponding reactants. Also, inasmuch as no, or substantially no, chemical reactions occur in the deposition chamber 2 the chamber 2 can be designed, constructed and maintenanced at a reduced cost in comparison to chemical reaction chambers. Moreover, inasmuch as it is easier to control a chemical decomposition than a chemical reaction, it is easier to generate a high quality, stoichiometrically correct thin film using stabilized sources than corresponding reactants.

Further, changes in the composition of a thin film being deposited within the deposition chamber 2 are readily achieved by introducing different vaporized sources from the feed units 16, 22, 28 through the manifold 14 into the chamber 2 in an automatic, computer-controlled manner. Such changes are quite advantageous for many reasons. For example, the surface of the thin film can be tailored to achieve ohmic contacts and to reduce depolarization due to Schottky effects.

Although the discussed use of stabilized sources is a preferred aspect of the present invention, it will be understood that the present invention is not so limited. Rather, other aspects of the present invention, including the heating aspects discussed below, can be used in relation to vaporized sources which do react in the deposition chamber 2 before they are deposited on the substrate 6. Thus, the liquid, solid and gaseous materials introduced by the feed units 16, 22, 28 may be tuned for doping, stoichiometric modifications, and formation of other materials after they are vaporized and introduced into the deposition chamber 2.

Referring now to the first, second and third heating means 8, 10, 12 of the present invention, such heating means are preferably operated in combination in a predetermined manner by the computer control unit 36 to achieve a very high (precise) degree of control of the deposition of thin films within the chamber 2. In general, the heating means 8, 10, 12 will be controlled such that the temperature within the chamber 2 will gradually increase during the course of a thin film deposition.

The first heating means 8, which will include one or more units spaced about the deposition chamber 2, is preferably a light source for applying a spectral heating bath to the chamber 2. The spectral heating bath heats the vaporized source within the chamber 2 for dissociating a desired component(s) from the vaporized source to permit the component(s) to be deposited on the substrate 6. According to another preferred aspect of the present invention, the spectral heating bath applied by the first heating means 8 will be tuned to optimize/maximize the dissociation of the desired component(s) from the vaporized source. In other words, the heat waves/rays provided by the first heating means will be controlled, in a predetermined manner, to correspond to the energy needed to dissociate or crack the bonds holding the desired component(s) in the vaporized source. Some preferred optical sources which could be used in the first heating means 8 are ultraviolet (UV) lamps and excimer lasers.

As an example, if a ferroelectric thin film of $PbTiO_3$ is being deposited from a vaporized sol-gel source, it would be preferable to use a Danielson-type UV light source device controlled to emit UV light rays having a wavelength of approximately 180–260 nanometers. UV light rays in this wavelength range are particularly effective in resonating and dissociating the hydroxyl bonds holding the $PbTiO_3$ in the vaporized source.

Regardless of which type of optical source (or sources) is used as the first heating means 8, the heating means 8 can controlled in either a pulsed manner or a constant manner. However, if an ultraviolet light source is used as the first heating means 8, it is preferable to operate the UV light source in a pulsed manner. Such pulsed operation of the UV light source is desirable because it reduces the amount of ozone generated by the spectral bath within the deposition chamber 2 (bearing in mind that many of the complex thin films which may be deposited by the present invention contain oxygen), and because it prevents the UV light source from overheating.

The second heating means 10 according to the present invention can be a conventional resistive heat bias type heater which is controlled by the computer control unit 36 to generate a high ambient temperature within the deposition chamber 2 and/or to heat the substrates 6.

With conventional CVD apparatus and methods, heating of a reaction chamber is achieved primarily using resistive heat bias type heaters. In the conventional CVD methods, the resistive heaters are operated to heat the chamber to a sufficiently high temperature to induce a chemical reaction of reactive components in a vaporized source and to deposit a resulting reaction product. Use of resistive heat bias type heaters as the primary or exclusive heat source in depositions of complex (compound) thin films has many disadvantages. For example, the entire space or ambient within the deposition chamber must be heated to a very high temperature to induce chemical reactions and thin film deposition. Such high ambient temperatures are quite undesirable because they create pores or pop holes, secondary phases, large grains, and serious non-stoichiometry in the complex thin films being deposited, as discussed above. Also, resistive heat bias type heaters cannot be controlled in a precise manner to apply heat in a substantially instantaneous, focused manner or in short, rapid time cycles.

According to the present invention the second heating means is preferably operated to create/achieve an ambient temperature within the deposition chamber 2 which is not sufficient in and of itself to dissociate the desired component(s) from the vaporized compound source and deposit these component(s) on the substrates 6. Rather, the second heating means 10 is preferably operated to create an ambient temperature within the chamber 2 which when combined with the tuned spectral bath provided by the first heating means 8 and the timed heat pulses of the third heating means 12 (discussed in detail hereinbelow) will dissociate the desired component(s) from the vaporized source in an optimized, precisely controlled manner, without detrimentally affecting the deposited thin film or the underlying substrates 6.

Note, in controlling the first, second and third heating means 8, 10, 12, two opposing considerations will have to be weighed. On the one hand, higher quality of the deposited complex thin films can be achieved at lower ambient temperatures, but on the other hand higher production rates can be achieved at higher ambient temperatures. Although a generally high throughput, or production rate, is achieved according to the present invention in comparison to conventional CVD techniques, it is possible to achieve even greater throughput by increasing the ambient temperature within the deposition chamber.

The third heating means 12, which will also include one or more units spaced about the deposition chamber 2, is controlled by the computer control unit 36 to apply heat energy heating pulses to the vaporized source within the deposition chamber 2 in a carefully timed/synchronized manner corresponding to a plurality of factors, including input flow rate of the vaporized source into chamber 2, desired thin film layer thickness, and (if necessary) the energy requirements needed to activate the thin film being deposited. Note, with many complex thin films, such as ferroelectrics, it is necessary to activate the polar lattices of the film before the films will function in a desired manner.

More specifically, the third heating means 12 is controlled by the computer control unit 36 so as to rapidly thermally stress the deposition chamber 2 with carefully timed/sequenced, high energy heating pulses during the course of a thin film deposition. The rapid thermal stressing of the deposition chamber 2 is preferably, theoretically calculated so that at every instant the thin film is at the right activation temperature for deposition, whereby the polar lattice of the thin film being deposited is being properly, dynamically activated. Further, the rapid thermal stressing would be calculated and controlled for continuing dissociation of the desired component(s) from the vaporized compound source to prevent the formation of large grains and secondary phases in the deposited thin film, and to maintain the temperature of the deposited thin film within acceptable limits of the particular substrate 6 onto which the film is being deposited, which may be an integrated circuit (IC). Note, acceptable limits of IC processing are a function of the particular IC step at which the thin film is being deposited. In other words, the temperature cannot be so high as to damage the underlying substrate or IC onto which the thin film is being deposited.

The third heating means 12 preferably includes one or more halogen lamps, water cooled are lamps and/or microwave sources which will be placed about the deposition chamber 2 and aimed to direct high energy pulses towards a thin film being deposited.

Note that if the first heating means 8 is pulsed for reasons discussed above, such pulsing may (but not necessarily) correspond to the time sequence of the high energy heating pulses applied by the third heating means 12.

The third heating means 12 is a very important aspect of the present invention in that it is controllable with a high degree of precision to quickly provide large amounts of energy when it is needed and where it is needed. By controlling the third heating means 12 it is possible to precisely control: the rate of chemical dissociations within the chamber 2; the layer by layer thickness of the thin film being deposited; and the activation of the thin film being deposited as discussed above.

For example, if a ferroelectric thin film of $PbTiO_3$ is being deposited, the first heating means 8 would be tuned to maximize dissociation of the hydroxyl bonds as discussed above, and the third heating means 12 would be actuated in short cycles, such as 3–10 seconds, so as to rapidly thermal stress the deposition chamber 2 to permit the $PbTiO_3$ to be properly deposited and activated over the substrate 6 in a very uniform, layer by layer manner.

A very important parameter of many complex thin films, such as ferroelectrics, is that they are generally required to be quite thin (for example, within a range of 500 angstroms–5000 angstroms) and such film thicknesses can be readily achieved according to the present invention. Of course, the present invention can be used to generate much thicker films, if desired.

As discussed above, the methods and apparatus according to the present invention will generally be controlled such that the temperature within the deposition chamber 2 progressively increases over the course of a film's deposition. Most preferably, such temperature increase will be precisely controlled in a stepped manner and the computer control unit 36 will be programmed with information pertaining to the temperature of the deposition process at each step thereof, $T_{si}t$ (si=time interval of the ith step), and the temperature rising rate $\pi$ within the deposition chamber 2,$\pi$.

A second (optional) use of the third heating means 12 is in-situ annealing of a deposited thin film within the deposition chamber 2 as a final processing step. The desirability or need for this final annealing step is essentially a quality control issue. Usually after the proper thin film thickness has been deposited, the third heating means 12 is controlled to apply high temperature pulses (for example 700° C.–950° C.) to the thin film for an appropriate time period. Such appropriate time period can be as little as three seconds and should not exceed two minutes. This rapid, in-situ, thermal annealing technique is particularly advantageous because it essentially eliminates the loss of certain critical elements (such as lead) which undesirably occurs during conventional, high temperature annealing processes.

Also, according to the present invention it is contemplated that a freeze drying unit 34 (or cold bed) can be used in addition to the first, second and third heating means for lowering the temperature of the deposition chamber 2 as desired or needed in any given CVD process. Again, such freeze drying unit 34 would be controlled by the computer control unit 36 according to predetermined parameters.

As shown, the present invention also includes a vacuum pump 30 because the present invention is preferably effected as low pressure CVD (LPCVD) processes. Most preferably, thin film depositions will be carried out at pressures in the range of $10^{-3}$ torr through $10^{-6}$ torr.

Referring to FIG. 2, there is shown a flow chart of a preferred, computer controlled deposition process according to the present invention. Specifically, at the first stage 102 the computer process is started or initialized. At stage 104, the desired parameters of the thin film to be deposited are programmed into the computer including, desired thickness of the thin film, UV bandwidth of the first heating means 8, thermal stress sequencing to be effected by the second heating means 10, activation requirements of the thin film, mass flow of the vaporized source from the feed units 16, 22, 28 into the manifold 14 and from the manifold into the deposition chamber 2, the number of timed steps and step size for the deposition process, and an initialization of a counter. Note, the activation requirements of the thin film are primarily functions of: (1) the temperature of the deposition process at each step thereof, $T_{si}t$; and (to) the temperature rising rate $\pi$ within the deposition chamber $\pi$.

At stage 106 of the process, the computer control unit 36 determines, on the basis of the signal from the analyzer 32, whether maximum dissociation of the desired component(s) is occurring within the deposition chamber 2. If maximum dissociation is not occurring, the computer control unit 36 will adjust one or more process parameters (including retuning of the first heating means 8, adjusting mass flow, and adjusting the third heating means 12 to change the ambient temperature within the deposition chamber 2) at stage 108 of the process. At stage 110, the computer control unit 36 initializes thin film deposition, such as by introducing the substrates 6. At stage 112, the computer control unit 36 continues the deposition process, including progressively increasing the temperature within the deposition chamber 2. At stage 114, the thickness of the deposited thin film is monitored (using conventionally known means) to determine if a desired film thickness has been achieved. If the desired film thickness has not been achieved, the deposition is continued through stages 116 and 112. Once the desired film thickness is achieved, a determination is made, at stage 118, as to whether or not the deposited thin film is to be annealed in-situ. If the annealing step is desired, it will be conducted at stage 120, in the manner discussed above. After the annealing step is completed, or if annealing is not desired, the process is stopped at stage 122.

As will be understood from the foregoing, the CVD apparatus and processes according to the present invention are particularly advantageous in depositing complex, compound thin films of material such as ferroelectrics, super-conductors, materials with high dielectric constants, gems, etc. However, it will be understood that the present invention is not limited to depositing such complex thin films. Also, it will be understood that the concepts of the present invention can be readily modified in view of other processing technologies and techniques known to those skilled in the art.

Although there has been described what is at present considered to be the preferred embodiments of the present invention, it will be understood that the invention can be embodied in other specific forms without departing from the spirit or essential characteristics thereof. The present embodiments are, therefore, to be considered in all aspects as illustrative and not restrictive. The scope of the invention is indicated by the appended claims rather than the foregoing description.

We claim:

1. An apparatus for depositing a stoichiometrically-correct thin film of a complex chemical compound on a substrate, comprising:
    a deposition chamber having an enclosed space therein;
    means for introducing at least one vaporized compound source into the deposition chamber at a predetermined flow rate;
    means for applying a spectral heating bath to the deposition chamber for heating the vaporized compound source as introduced therein; and
    control means for controlling the flow rate of said at least one vaporized compound source into the deposition chamber and for controlling said spectral heating bath applying means such that said bath provided thereby is optimally tuned to dissociate at least one complex chemical compound from said at least one vaporized compound source and to deposit said complex chemical compound on a substrate within the deposition chamber;
    said introducing means being adapted to introduce said vaporized compound source into the said deposition chamber as a stabilized source including a substantially stoichiometrically-correct quantity of said at least one complex chemical compound and which will substantially not chemically react to destabilize said complex chemical compound of its pre-established, stoichiometrically-correct formulation within said deposition chamber.

2. Apparatus according to claim 1, including:
    means for heating the space within the deposition chamber to an elevated temperature;
    said control means is adapted to control said heating means such that the heat provided thereby is insufficient to dissociate said at least one chemical compound from said at least one vaporized compound source; and
    said control means is further adapted to control said spectral heat bath applying means and said heating means in combination such that the heat provided thereby optimizes said dissociation and said deposition of said at least one chemical compound.

3. Apparatus according to claim 2, wherein:
    said spectral heat bath applying means includes a U.V. light source; and
    said heating means includes a resistive heat bias heater.

4. Apparatus according to claim 2, including:
    means for selectively applying high energy heating pulses to the deposition chamber to rapidly thermally stress said at least one vaporized compound source as introduced into the deposition chamber and said chemical compound being deposited on the substrate.

5. Apparatus according to claim 4, wherein:
    said control means controls said heating pulse applying means such that said pulses are applied in a stepped, timed sequence based on said predetermined flow rate, on a desired thickness of said at least one chemical compound being deposited, and on a predetermined activation energy of said at least one chemical compound being deposited.

6. Apparatus according to claim 4, wherein:
    said heating pulse applying means comprises a radiant energy source for generating said pulses.

7. Apparatus according to claim 4, wherein:
    said heating pulse applying means includes at least one halogen lamp.

8. A method according to claim 1, wherein:
    said stabilized source comprises a substantially stoichiometrically-correct quantity of a metal organic compound.

9. Apparatus according to claim 8, wherein:
    said metal organic compound is a ferroelectric material.

10. Apparatus according to claim 1, wherein:
    said introducing means includes means for generating said stabilized vaporized source by wetting a carrier gas with a stabilized liquid source; and
    said stabilized liquid source is selected from the group consisting of sol-gels and metal organic decomposition formulations.

11. Apparatus according to claim 4, wherein:
    said control means is adapted to control said heating pulse applying means in a predetermined manner so as to anneal in-situ within said chamber a thin film of said chemical compound as deposited on said substrate.

12. Apparatus according to claim 11, wherein:
    said at least one chemical compound is a metal organic compound; and
    said control means is adapted to control said heating pulse applying means so that said thin film is annealed at a temperature in the range of 700°-950° C.

13. Apparatus according to claim 4, wherein:
said control means controls said heating means, said spectral heating bath applying means, and said heating pulse applying means in combination so as to prevent the formation of large grains, secondary phases and the like in said at least one chemical compound being deposited.

14. Apparatus according to claim 1, wherein:
said at least one stabilized source comprises a vaporized solution of said at least one chemical compound and an organic solvent; and
said spectral heating bath applying means is tuned to provide an optimum energy for dissociation said at least one chemical compound from said organic solvent.

15. Apparatus according to claim 1, wherein:
said at least one stabilized source comprises vaporized dispersion of said at least one chemical compound and an organic dispersion medium; and
said spectral heating bath applying means is tuned to provide an optimum energy for dissociating said at least one chemical compound from said dispersion medium.

16. Apparatus for depositing a thin film on a substrate, comprising:
a deposition chamber having an enclosed space therein;
means for introducing at least one vaporized compound source into said chamber at a predetermined flow rate;
means for applying a spectral heat bath to said chamber for heating said source as introduced therein;
means for selectively applying high energy heating pulses to said chamber to rapidly thermally stress said source as introduced into said chamber; and
control means for controlling the flow rate of said source into said chamber, and for controlling said spectral heat bath applying means and said heating pulse applying means in combination to optimize the dissociation of said component from said source and the deposition of said component on a substrate within said chamber.

17. Apparatus according to claim 16, wherein:
said control means controls said heating pulse applying means such that the pulses are applied in a timed sequence based on the flow rate of the source and on a predetermined thin film thickness.

18. Apparatus according to claim 16, wherein:
said control means controls said heating pulse applying means such that said pulses are applied in a timed sequence based on said flow rate of said source and on energy requirements needed to dynamically activate said component being deposited.

19. Apparatus according to claim 16, wherein:
said control means is adapted to control said heating pulse applying means in a predetermined manner so as to anneal in-situ within said chamber a thin film of said chemical compound as deposited on said substrate.

20. An apparatus for depositing a thin film on a substrate, comprising:
a deposition chamber having an enclosed space therein;
means for introducing at least one vaporized compound source into the deposition chamber at a predetermined flow rate;
first heating means for applying a spectral heating bath to the deposition chamber for heating the vaporized compound source as introduced therein;
second heating means for heating the space within the deposition chamber to an elevated temperature;
third heating means for selectively applying high energy heating pulses to the deposition chamber to rapidly thermally stress said at least one vaporized compound source as introduced into the deposition chamber; and
control means for controlling said first, second and third heating means in combination such that the heat provided thereby optimizes dissociation of at least one component from said at least one vaporized compound source and deposition of said component on a substrate within the chamber.

* * * * *

UNITED STATES PATENT AND TRADEMARK OFFICE
CERTIFICATE OF CORRECTION

PATENT NO. : 5,119,760
DATED : June 9, 1992
INVENTOR(S) : Larry D. McMillan and Carlos A. Paz de Araujo It is certified that error appears in the above-identified patent and that said Letters Patent is hereby corrected as shown below:

Column 1, line 5, change "application" (second occurrence) to -- Application --;
        line 23, change "superconductors" to -- super-conductors --.

Column 4, line 12, change "superconductors" to -- super-conductors --.
Column 7, line 38, change "are" to -- arc --.
Column 8, line 13, change "ith" to -- i<u>th</u> --;
        line 14, change "2, $\pi$" to -- 2 --;
        line 62, delete "$\pi$".

Signed and Sealed this

Eighteenth Day of January, 1994

Attest:

BRUCE LEHMAN

*Attesting Officer*      *Commissioner of Patents and Trademarks*